United States Patent [19]
Hewitt

[11] Patent Number: 5,859,995
[45] Date of Patent: *Jan. 12, 1999

[54] METHOD AND APPARATUS FOR COORDINATING COMBINATORIAL LOGIC-CLOCKED STATE MACHINES

[75] Inventor: Larry D. Hewitt, Austin, Tex.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 373,689

[22] Filed: Jan. 17, 1995

Related U.S. Application Data

[63] Continuation-in-part of Ser. No. 333,451, Nov. 2, 1994, abandoned.

[51] Int. Cl.[6] .................................................... G06F 1/04
[52] U.S. Cl. .......................... 395/551; 395/556; 395/557; 395/559; 326/93; 326/94
[58] Field of Search ..................................... 395/800, 551, 395/557, 559, 556; 364/DIG. 1; 326/93, 94

[56] References Cited

U.S. PATENT DOCUMENTS

| | | | |
|---|---|---|---|
| 3,931,614 | 1/1976 | Vasa et al. ............................. | 340/172.5 |
| 4,293,919 | 10/1981 | Dasgupta et al. ........................ | 364/716 |
| 4,580,137 | 4/1986 | Fiedler et al. ...................... | 340/825.68 |
| 5,250,858 | 10/1993 | Strong ...................................... | 307/465 |
| 5,280,595 | 1/1994 | Lemay et al. ............................. | 395/425 |
| 5,426,784 | 6/1995 | Kawata et al. ........................... | 395/800 |
| 5,511,181 | 4/1996 | Baxter ...................................... | 395/550 |

*Primary Examiner*—Alyssa H. Bowler
*Assistant Examiner*—Dzung C. Nguyen
*Attorney, Agent, or Firm*—Skjerven, Morrill, MacPherson, Franklin & Friel, L.L.P.; Stephen A. Terrile

[57] ABSTRACT

A triggering circuit obviates propagation differences in differential combinatorial logic clocking of upstream and downstream state machines ("SM's"). The triggering circuit imposes an output state on the downstream SM in response to the appearance of an appropriate combination of the upstream SM output state and selected data at the triggering circuit input. The triggering circuit and the upstream SM are clocked from a common signal preventing the upstream SM from changing state before the triggering circuit produces the proper signal to impose the expected state on the downstream SM. The downstream SM takes on the correct output state in dependable correspondence with a selected upstream SM output state. In a preferred embodiment, a D flip-flop generates a triggering signal in response to a selected combination of upstream SM output state and system data. The D flip-flop triggering signal imposes a selected output state on a downstream SM through the asynchronous SET and CLEAR inputs of the downstream SM flip-flops. Because the D flip-flop and upstream SM are both clocked off the same trailing edge of the WRITE line, the upstream SM and D flip-flop change state together, preventing the upstream SM from changing state before the triggering signal is generated.

16 Claims, 5 Drawing Sheets

METHOD AND APPARATUS FOR COORDINATING COMBINATORIAL LOGIC-CLOCKED STATE MACHINES

RELATED APPLICATIONS

This application is a continuation-in-part of U.S. Pat. application Ser. No. 08/333,451 filed Nov. 2, 1994, now abandoned, which is hereby incorporated in its entirety by reference.

TECHNICAL FIELD

The present invention relates to plural state machine systems, and in particular, to the coordination of state machines clocked with combinatorial logic within such plural state machine network systems.

THE BACKGROUND OF THE INVENTION

State machines are generally multiple flip-flop combinations having present state values derived from previous state values and present input signals. Multiple state machines may be combined in plural state machine network systems to articulate functional relationships between prior state values and current system input signals.

When, within such systems, different constituent state machines are clocked from differing sets of combinatorial logic, variations in propagation times makes coordination between state machines problematic. The status of the inputs to the combination, the Boolean function articulated through the logical combination, and the technology used to implement the logic can all affect the propagation time through a particular combinatorial logic set. When the output of one combinatorially clocked state machine serves as an input to another state machine, predictable synchronization between state machines can become particularly uncertain.

There are known methods to reduce the uncertainty associated with clocking multiple state machines from combinatorial logic, but all are expensive and complex. For example, strobe signals for state machines can be derived from relatively complex arrangements of sequential logic using hardware counters. Multiple state machine sequencing can thus be more accurately controlled, but implementation is expensive and consumes integrated circuit chip area.

More sophisticated methods directed to accommodating unforeseen time dependencies amongst multiple state machines within plural state machine systems are known. However, these known techniques generally use a complicated virtual memory unit ("VMU") and a plurality of programmable array logic devices to monitor state machine status and make appropriate time dependency accommodations. Examples of such VMU techniques are purportedly taught in U.S. Pat. No. 5,280,595 to Lemay et al. However, none of the known methods achieve the required predictability with straight forward implementation at low cost. Therefore, what is needed is an inexpensive and hazard-free method and apparatus to control coordination of multiple state machines clocked through combinatorial logic.

SUMMARY OF THE INVENTION

An object of the present invention is, therefore, to provide a method and apparatus for controlling multiple, combinatorially clocked, state machines.

Another object of this invention is to provide such a method and apparatus adaptable to pipelined state machine combinations.

A further object of the present invention is to provide such a method and apparatus at low cost and with simple articulation.

The present invention uses a triggering circuit to obviate propagation differences in differential combinatorial logic clocking of upstream and downstream state machines ("SM's"). The triggering circuit imposes an output state on the downstream SM in response to the appearance of an appropriate combination of the upstream SM output state and selected data at the triggering circuit input. Because the triggering circuit and the upstream SM are clocked from a common signal, the upstream SM cannot change state before the triggering circuit produces the proper signal to impose the expected state on the downstream SM. Thus, the downstream SM takes on the correct output state in dependable correspondence with a selected upstream SM output state.

In a preferred embodiment, a D flip-flop generates a triggering signal in response to a selected combination of upstream SM output signal and system data. The D flip-flop triggering signal imposes a desired output state on a downstream SM through the asynchronous SET and CLEAR inputs of the downstream SM flip-flops. Because the D flip-flop and upstream SM are both clocked off the same trailing edge of the system WRITE line, the upstream SM and D flip-flop change state together, preventing the upstream SM from changing state before the triggering signal is generated.

Triggering circuit control of the downstream SM is cleared with a pulse derived from a Boolean combination of the common clocking signal antecedents and a delayed set of the same signals.

DETAILED DESCRIPTION OF A PREFERRED EMBODIMENT

Figure 1:
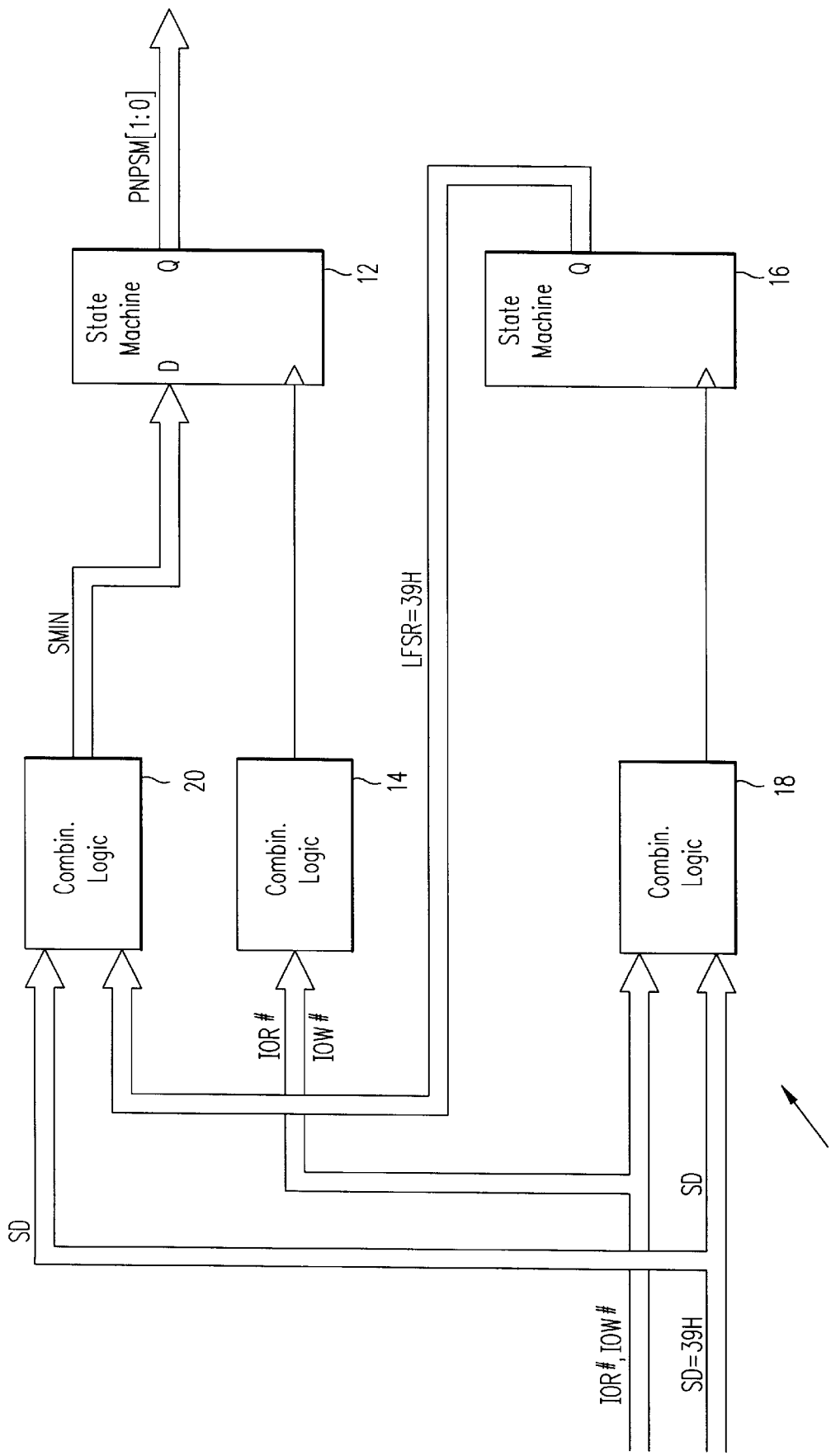
FIG. 1 is a block diagram of a plural state machine network having a pair of state machines, each clocked with different sets of combinatorial logic having differing propagation delays.

FIG. 1 shows a plural state machine network 10 nominally designed to articulate a Plug and Play interface for a PC audio circuit. Network 10 is designed to be compliant with the Plug and Play ISA specification and is illustrative of a system having unpredictable coordination between constituent state machines. Network 10 comprises two state machines, each clocked with a different set of combinatorial logic. State machine ("SM") 12 is clocked with combinatorial logic 14 and SM 16 is clocked with combinatorial logic 18. The output of SM 12 and therefore, network 10, is PNPSM[1:0] ("PNPSM") and has four possible states: (0,0) corresponding to wait-for-key ("WFK"), (0,1) corresponding to isolation ("ISO"), (1,1) corresponding to configuration ("CONFIG"), and (1,0) corresponding to sleep ("SLEEP").

As depicted in FIG. 1, the output of SM 16 is output status signal LFSR. Signal LFSR is an input to combinatorial logic 20. Signal system data ("SD") is an input to both logic 18 and logic 20. The output of logic 20 is signal SMIN. Signals IOR# and IOW# are inputs to logic 14 and logic 18.

Differences between the speed of logic 18 and logic 14 can cause the resultant state of SM 12 to vary. For example, when LFSR reaches 39H, PNPSM should go from WFK(0, 0) to SLEEP(1,0) if SD equals 39H. To remain compliant with the ISA specification, signals LFSR and PNPSM should change on the trailing edge of IOW#. However, LFSR is the output signal of SM 16 which is clocked through logic 18 and PNPSM is the output signal of SM 12 which is clocked through logic 14. Logic 18 and logic 14 have different propagation delays. If logic 18 is faster than logic 14, LFSR may change from 39H before logic 14 has clocked SM 12, thus making SMIN incorrect when the clocking of SM 12 finally occurs.

Figure 2:
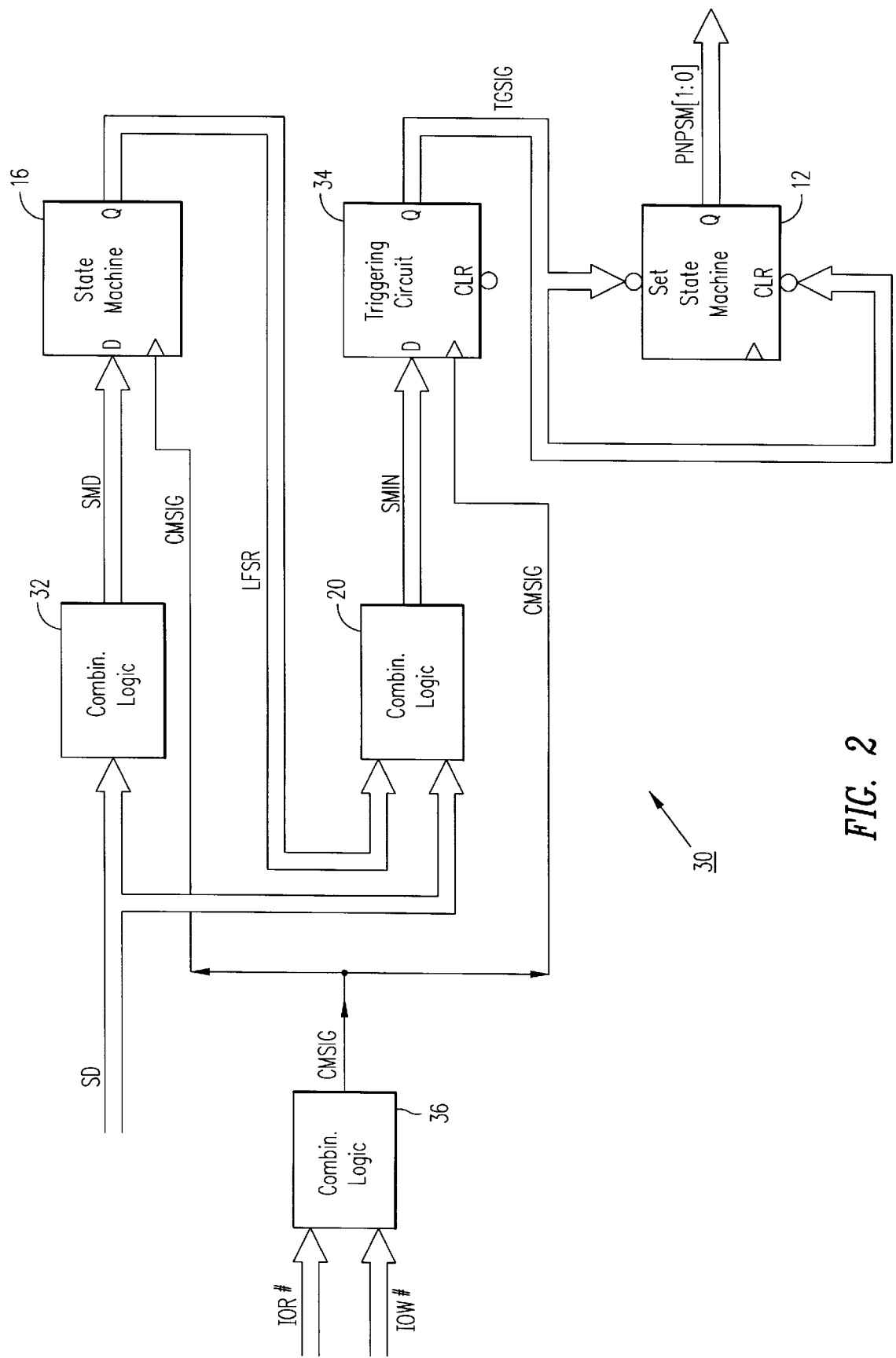
FIG. 2 is a block diagram of the system of FIG. 1 having state machines arranged and controlled in accordance with the present invention.

FIG. 2 is a block diagram of network 30 depicting a preferred embodiment of the present invention. Network 30 employs the signal from a triggering circuit of predictable state to force the correct state on SM 12.

Network 30 utilizes the two state machines, SM 12 and SM 16, depicted in FIG. 1. In network 30, however, signal TGSIG from trigger circuit 34, forces the output of SM 12 into output state SLEEP from state WFK when the proper logical antecedents arise. Clocking SM 12 and SM 16 with differing combinatorial logic sets having differing propagation times becomes irrelevant as SM 12 changes state in proper correspondence with SM 16 in response to TGSIG.

In network 30, signal SD comprises an input signal to combinatorial logic 32 and combinatorial logic 20. The output signal of logic 32 is signal SMD and provides the D input to SM 16. Output signal LFSR from SM 16 is combined with signal SD through logic 20 to produce output signal SMIN that provides the D input to trigger circuit 34. Trigger circuit 34 is an edge triggered D flip-flop with output signal TGSIG. System input signals IOR# and IOW# comprise the antecedent input signals to clocking logic 36. The output signal from logic 36 is CMSIG which is the clocking signal for both SM 16 and trigger 34.

When SD equals 39H and LFSR equals 39H, logic 20 will produce the correct SMIN signal at the D input of trigger 34. On the next clocking of CMSIG off the trailing edge of IOW#, the correct value of TGSIG will be clocked out from trigger 34.

SM 16 and trigger 34 are clocked from the common signal CMSIG. Therefore, because LFSR is the output signal of SM 16, LFSR cannot change until CMSIG is clocked again. However, that next clocking of CMSIG propagates the correct SMIN through trigger 34 to TGSIG. Therefore, because SM 16 and trigger 34 are clocked by common signal CMSIG, LFSR cannot race ahead of SMIN and consequently, TGSIG and LFSR always bear the proper relationship. TGSIG then imposes the desired state on SM 12 through the asynchronous SET and CLEAR inputs to SM 12.

Figure 3:
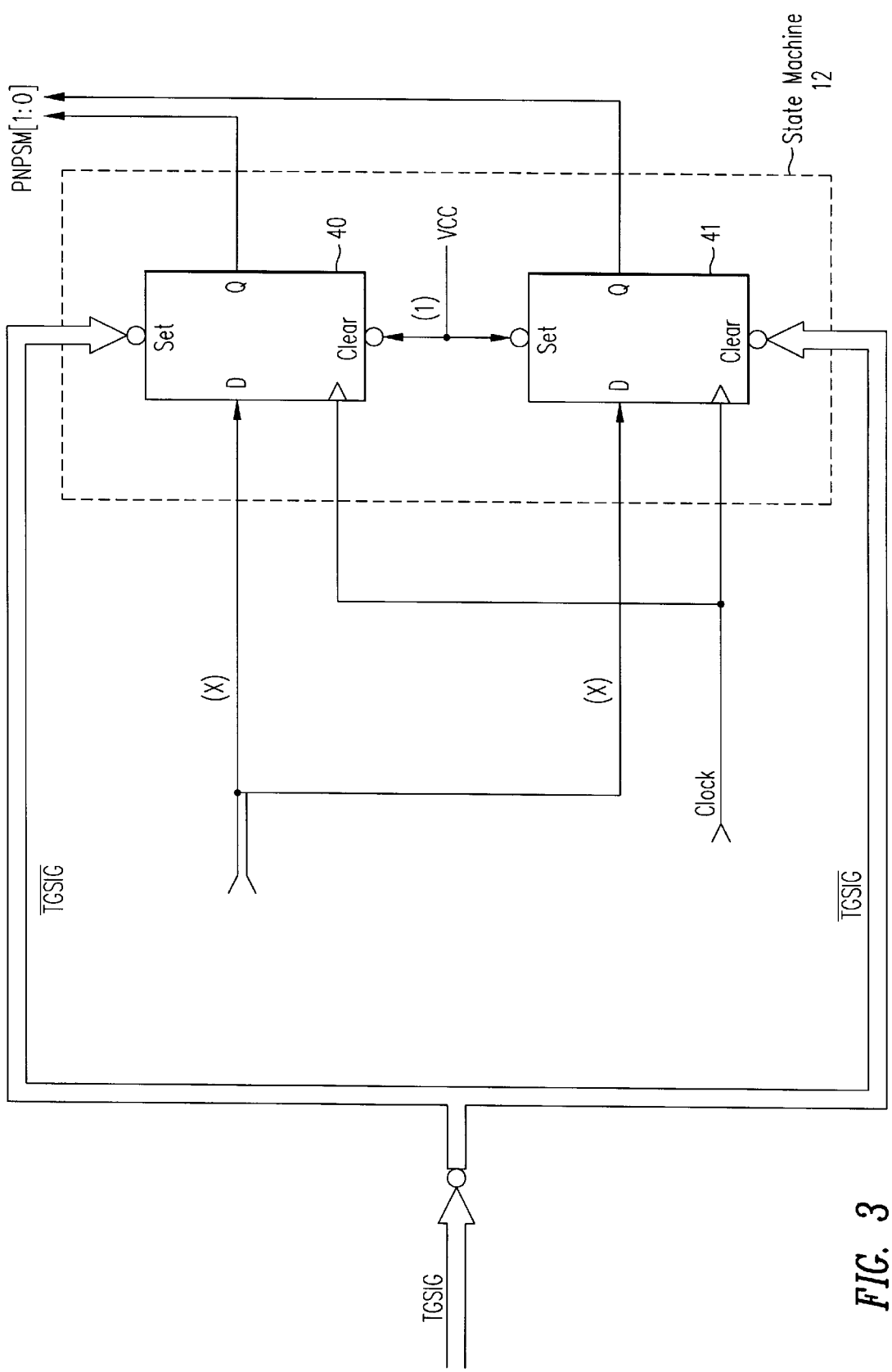
FIG. 3 is a diagram depicting the D flip-flops that comprise state machine 12 of FIG. 2.

FIG. 3 depicts the relationship between the signal TGSIG and SM 12 in network 30. SM 12 is comprised of two D flip-flops, 40 and 41 respectively. Flip-flops 40 and 41 have output signals that concatenate into the network 30 output signal PNPSM[1:0]. As FIG. 3 shows, when inverted, signal TGSIG imposes the output state SLEEP(1,0) on PNPSM [1:0] by forcing the upper bit to a 1 and the lower bit to a 0 through the asynchronous SET and CLEAR inputs to flip-flops 40 and 41 respectively. Flip-flops 40 and 41 are clocked, but as FIG. 3 shows, when TGSIG is active, the D inputs to flip-flops 40 and 41 are both a don't care (X) signal.

TGSIG will impose the correct state on SM 12 when the anticipated antecedents for the SLEEP state conjugate.

Figure 4:
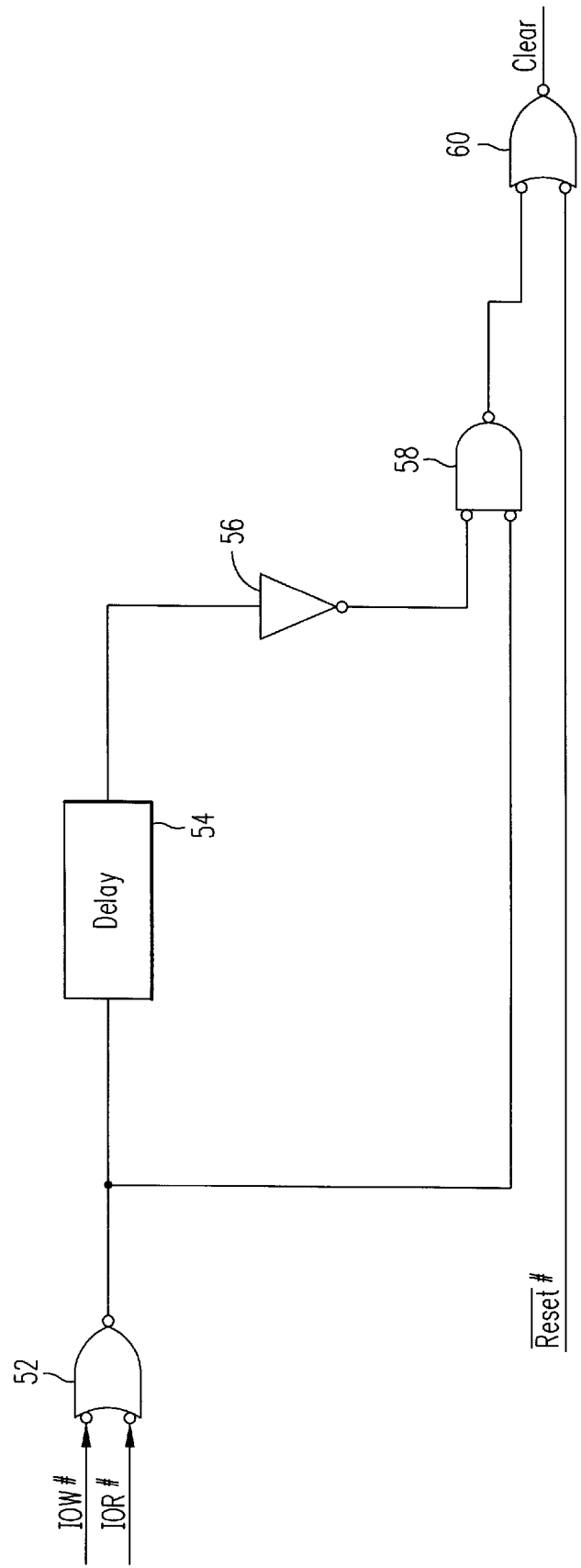
FIG. 4 is a block diagram of the CLEAR pulse circuitry devised in accordance with the present invention.
Figure 5:
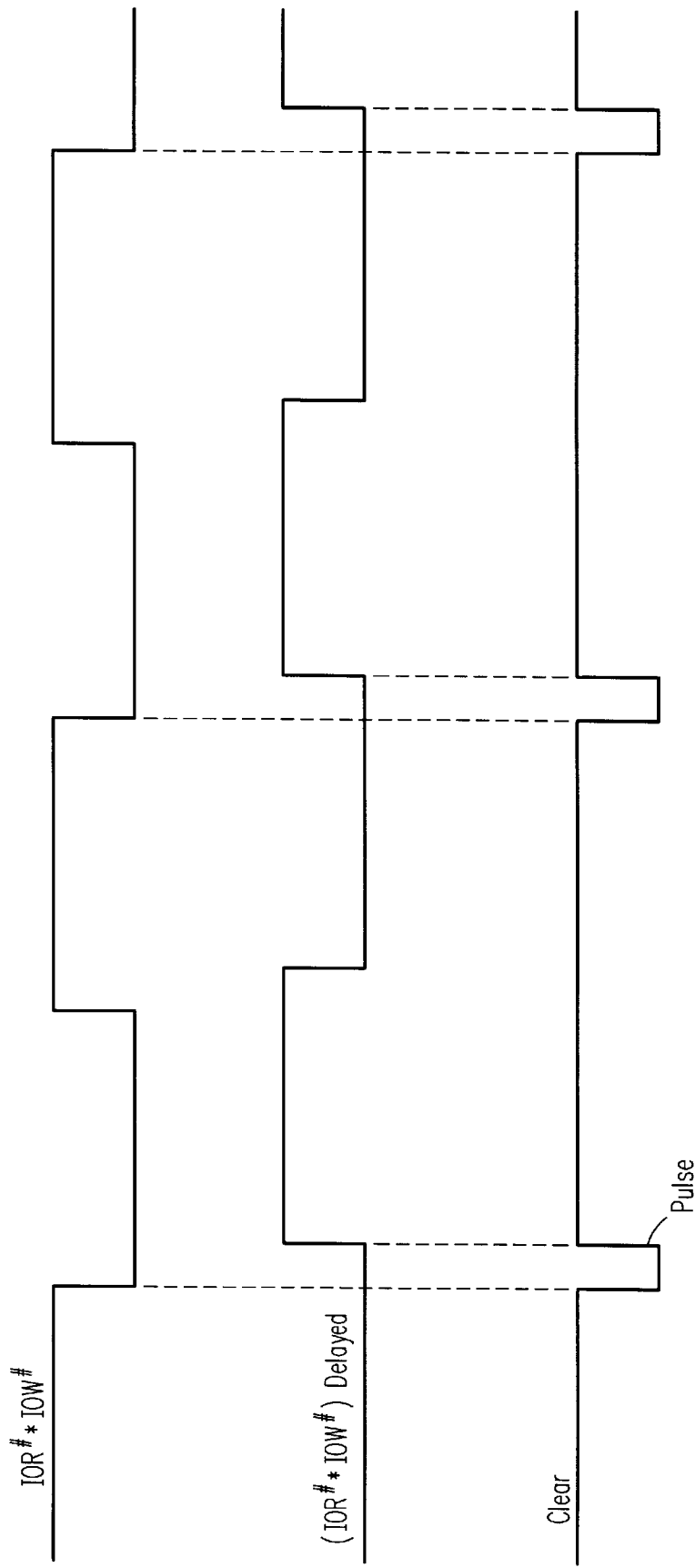
FIG. 5 is a timing diagram depicting the relationship between the derived CLEAR pulse, the WRITE line, and the READ line in a preferred embodiment of the present invention.

In a preferred embodiment, PNPSM should maintain the SLEEP state only until the next leading edge of IOR# or IOW#. In a preferred embodiment, a CLEAR pulse is derived from the next leading edge of signal IOR# or IOW#. FIG. 4 is a block diagram of CLEAR pulse circuitry devised in accordance with the present invention to clear trigger 34 and release SM 12 to normal operation. FIG. 5 is a timing diagram depicting the relationship between IOR#, IOW# and the CLEAR pulse resulting from the circuit of FIG. 4.

The state of network output signal PNPSM may imposed by employing TGSIG to manipulate the asynchronous SET and CLEAR inputs of flip-flops 40 and 41 of FIG. 3. However, flip-flops 40 and 41 of SM 12 operate normally in response to D inputs and clocking signals when their SET and CLEAR inputs are held at 1. Therefore, a signal devised to release SM 12 to normal operation will pulse the CLEAR input of triggering circuit 34. In response to the CLEAR pulse on triggering circuit 34, TGSIG will go LOW, thus bringing the SET input of flip-flop 40 to HIGH and the CLEAR input of flip-flop 41 to HIGH freeing state machine 12 to operate normally in response to D inputs.

FIG. 4 depicts a preferred circuit 50 designed to generate an appropriate CLEAR pulse devised to clear the TGSIG output of triggering circuit 34. Many variations in the articulating logic are possible, however, and a variety of combinations will yield appropriate results as those skill in the art will recognize.

Inputs IOR# and IOW# are AND'd by gate 52. The combined signal IOW*IOR is delayed through delay circuit 54 and inverted by inverter 56. The delayed and inverted signal IOW*IOR$_{delayed}$ is OR'd with IOW*IOR by gate 58 and the resulting signal is AND'd by gate 60 with a RESET# signal. As long as either IOW*IOR or IOW*IOR$_{delayed}$ remains HIGH, the output of gate 60 will be HIGH as long as RESET# remains HIGH. If any of the signals IOW*IOR, IOW*IOR$_{delayed}$, or RESET# go LOW, the CLEAR pulse will go LOW and trigger 34 will be cleared and TGSIG will go LOW. A LOW TGSIG will release SM 12 to normal operation.

FIG. 5 illustrates the timing relationship between the signals IOW*IOR, IOW*IOR$_{delayed}$, and the devised CLEAR pulse as described above in reference to FIG. 4.

It will be obvious to those having skill in the art that many changes may be made in the above-described details of a preferred embodiment of the present invention without departing from the underlying principles thereof. The scope of the present invention should, therefore, be determined only by the following claims.

I claim:

1. A method of coordinating first and second sequential networks clocked through combinatorial logic, said method comprising the steps of:

providing a first fixable sequential network having output determining inputs;

providing a second sequential network having a second sequential network status signal;

providing a triggering network;

clocking said second sequential network and said triggering network with a common signal;

supplying an input signal, derived according to said second sequential network status signal, to said triggering network to derive a triggering network output signal;

supplying said triggering network output signal to said output determining inputs of said first fixable sequential network; and determining a predetermined sequential network output condition according to said triggering network output signal.

2. The method of claim 1 wherein said input signal is further derived according to a system data signal.

3. The method of claim 1 wherein said selected second sequential network status signal is derived according to a system data signal.

4. The method of claim 1 wherein said triggering network output signal is derived according to a logical input combination comprising said second sequential network status signal and a preselected data condition.

5. The method of claim 1 wherein said common signal is derived according to a logical combination of system signals.

6. The method of claim 1 further comprising: clearing said determined first sequential network output condition after a predetermined period of time related to a system signal.

7. A method of regulating a first sequential network dependency upon a second sequential network status signal, said method comprising the steps of:

providing a first fixable sequential network having output determining inputs;

providing a second sequential network;

providing a trigger network;

clocking said trigger network and said second sequential network by a common signal;

supplying the second sequential network status signal to said trigger network to produce a triggering network signal; and fixing an output condition of said first fixable sequential network by supplying said triggering network signal to said output determining inputs of said first fixable sequential network.

8. A method for regulating a combination of state machines, said combination comprising a first fixable state machine and a second state machine, said method comprising the steps of:

providing a trigger source having an output signal;

clocking said trigger source and said second state machine from a common signal;

supplying a second state machine status signal to said trigger source;

fixing a first state machine condition by supplying said trigger source output signal to the first fixable state machine.

9. The method of claim 8 wherein said fixed first state machine condition is cleared after a predetermined time period by supplying a system signal derived clear signal to the first fixable state machine.

10. A sequential network system having constituent plural sequential networks, said system comprising:

a first sequential network having a status signal;

a triggering circuit having a triggering signal derived from said status signal;

a clocking circuit having a clocking signal provided to said first sequential network and said triggering circuit, said clocking signal temporally relating said status signal and said triggering signal; and a second fixable sequential network having an output state imposed by said triggering signal in correspondence to said status signal.

11. The system of claim 10 wherein a clear pulse derived from a system signal is supplied to said triggering circuit after a predetermined time period.

12. The system of claim 10 wherein said second fixable sequential network comprises a set of flip-flops having output controllable inputs.

13. The system of claim 12 wherein said output state is imposed by supplying said triggering signal to said output controllable inputs of said set of flip-flops.

14. The system of claim 13 wherein said set of flip-flops comprises a plurality of D flip-flops.

15. The method according to claim 5 wherein said system signals comprise a write line and a read line.

16. The system as recited in claim 10 wherein the clocking circuit is coupled to a write line and a read line, said clocking circuit deriving the clocking signal according to the write line and the read line.

* * * * *